(12) United States Patent
Lee

(10) Patent No.: US 7,313,024 B2
(45) Date of Patent: Dec. 25, 2007

(54) NON-VOLATILE MEMORY DEVICE HAVING PAGE BUFFER FOR VERIFYING PRE-ERASE

(75) Inventor: Ju Yeab Lee, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/164,608

(22) Filed: Nov. 30, 2005

(65) Prior Publication Data

US 2006/0291289 A1 Dec. 28, 2006

(30) Foreign Application Priority Data

Mar. 15, 2005 (KR) ...................... 10-2005-0021493

(51) Int. Cl.
*G11C 11/34* (2006.01)
*G11C 16/06* (2006.01)
(52) U.S. Cl. .............................. 365/185.22; 365/185.29
(58) Field of Classification Search ........... 365/185.22, 365/185.29
See application file for complete search history.

(56) References Cited

U.S. PATENT DOCUMENTS

| 6,643,181 | B2 | 11/2003 | Sofer et al. | |
| 7,002,848 | B2 * | 2/2006 | Takase et al. | 365/185.28 |
| 2006/0034128 | A1 * | 2/2006 | Han et al. | 365/185.29 |

FOREIGN PATENT DOCUMENTS

| JP | 2002-025280 | 1/2002 |
| KP | 1997-0051361 | 7/1997 |
| KP | 10-0172408 | 10/1998 |
| KP | 10-2005-0011220 | 1/2005 |
| WO | WO-03/073431 A1 | 9/2003 |

\* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

Non-volatile memory devices have a page buffer that can verify pre-erase. A non-volatile memory device may include a cell array having a plurality of strings consisting of memory cells disposed at the intersection regions of bit lines and word lines, and a plurality of page buffers connected to the bit lines through a sensing line. Each of the plurality of page buffers may include a pre-erase detection unit that detects pre-erase in response to a signal of the sensing line in order to verify whether data programmed into the memory cells have been erased, a main erase detection unit that detects main erase in response to a signal of the sensing line in order to verify whether data programmed into the memory cells have been erased, a latch circuit which stores data in response to an output signal of the pre-erase detection unit at the time of pre-erase verify and stores data in response to an output signal of the main erase detection unit at the time of main erase verify, and a verify unit that verifies pass or fail of the pre-erase or main erase in response to a signal of the latch circuit at the time of pre-erase verify or main erase verify.

7 Claims, 3 Drawing Sheets

NON-VOLATILE MEMORY DEVICE HAVING PAGE BUFFER FOR VERIFYING PRE-ERASE

TECHNICAL FIELD

This patent relates to non-volatile memory devices, and more specifically, to a NAND flash memory device having a page buffer for pre-erase verification.

DISCUSSION OF RELATED ART

There is an increasing need for non-volatile memory devices which can be electrically programmed and erased and do not need for a refresh function of rewriting data at a constant cycle. The term "program" refers to an operation of writing data into memory cells.

For higher integration of memory devices, a NAND flash memory device in which a plurality of memory cells is connected in series (i.e., a structure in which neighboring cells share the drain or source) to form one string has been developed. The NAND flash memory device is a memory device that sequentially reads information unlike a NOR flash memory device.

The NAND flash memory device employs a page buffer in order to store a large capacity of information or read stored information with a short period of time. The page buffer functions to receive a large capacity of data from an I/O pad and provide the data to memory cells, or store data of the memory cells therein and then output the data. The page buffer is generally constructed of a single register in order to temporarily store data. Recently, however, the page buffer adopts a dual register in order to increase the program speed while programming a large capacity of data in the NAND flash memory device.

In the case where an erase operation is performed in the NAND flash memory device, there is a case where a cell is excessively erased due to an erasing speed, the threshold voltage (Vt) distribution of the cell, an erase bias and the like. In the case where the cell is excessively erased, an erase threshold voltage (Vt) of the cell must be kept to a proper level. To accomplish this, after a pre-erase operation is performed, a main erase operation has to be performed according to the pre-erase verify result.

FIG. 1 is a circuit diagram of a NAND flash memory device having an existing page buffer.

An erase verify method of the page buffer will be described below with reference to FIG. 1. A reset signal (MRST) is enabled to reset a node QA of a latch circuit 220 to "0" and a node QAb to "1". A PMOS transistor P11 is then turned on according to a precharge signal (PRECHb), so that a sensing line SO is precharged with a power supply voltage (VCC). Thereafter, if the sensing line SO maintains a precharged state, it means that programmed data are not erased from the cell. If electric charges of the sensing line SO are discharged to a selected bit line (e.g., BLe) by a bit line select & bias unit 210, it means that data programmed into a cell are successfully erased.

If data programmed into a cell are erased, i.e., if the sensing line SO is in a discharged state, the node QAb of the latch circuit 220 keeps intact "1". To the contrary, if data programmed into a cell are not erased, i.e., if the sensing line SO is in a precharged state, a NMOS transistor N21 is turned on and a NMOS transistor N22 is also turned on by a latch signal (MLCH), so that the node QAb of the latch circuit 220 is changed to "0".

The aforementioned page buffer of FIG. 1 cannot perform a pre-erase verification operation. The term "pre-erase" refers to verification that is performed after data programmed into a cell are weakly erased by applying a predetermined bias voltage to a programmed cell. If there is a cell that has not been erased after the pre-erase verify operation, data programmed into the cell are again erased by applying a predetermined bias voltage to a well in addition to the bias voltage that is firstly applied, so that the cell can be prevented from being excessively erased.

In this case, if a cell that is erased after the pre-erase operation is performed has a voltage lower than the threshold voltage (Vt), i.e., the sensing line SO is discharged, the voltage level of the node QAb or the node QA of the latch circuit 220 must be changed. The page buffer 200 shown in FIG. 1, however, cannot detect pre-erase since it is a transistor that is turned on as the NMOS transistor N21 to which a signal of the sensing line SO is input becomes logic high. Therefore, there is a need for a page buffer in which a voltage level of the node QAb of the latch circuit 220 can be changed depending on a pre-erase result.

SUMMARY OF INVENTION

A NAND flash memory device may have a page buffer that can verify pre-erase.

A non-volatile memory device may include a cell array having a plurality of strings consisting of memory cells disposed at the intersection regions of bit lines and word lines, and a plurality of page buffers connected to the bit lines through a sensing line. Each of the plurality of page buffers may include a pre-erase detection unit that detects pre-erase in response to a signal of the sensing line in order to firstly verify whether data programmed into the memory cells have been erased, a main erase detection unit that detects main erase in response to a signal of the sensing line in order to secondly verify whether data programmed into the memory cells have been erased, a latch circuit that stores data in response to an output signal of the pre-erase detection unit at the time of pre-erase verify and stores data in response to an output signal of the main erase detection unit at the time of main erase verify, and a verify unit that verifies pass or fail of the pre-erase or main erase in response to a signal of the latch circuit at the time of pre-erase verify or main erase verify.

DETAILED DESCRIPTION

Figure 1:
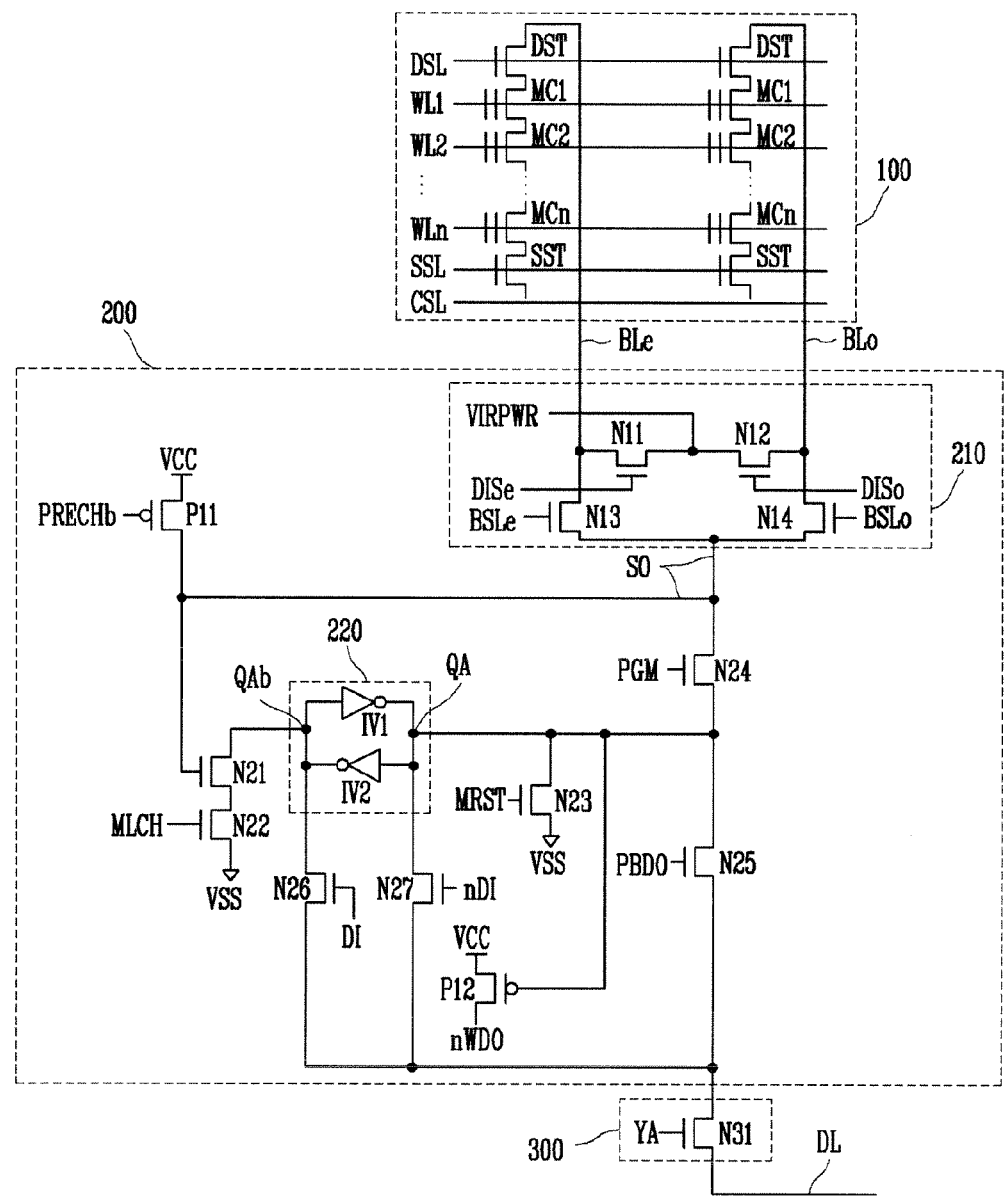
FIG. 1 is a circuit diagram of a NAND flash memory device having an existing page buffer.
Figure 2:
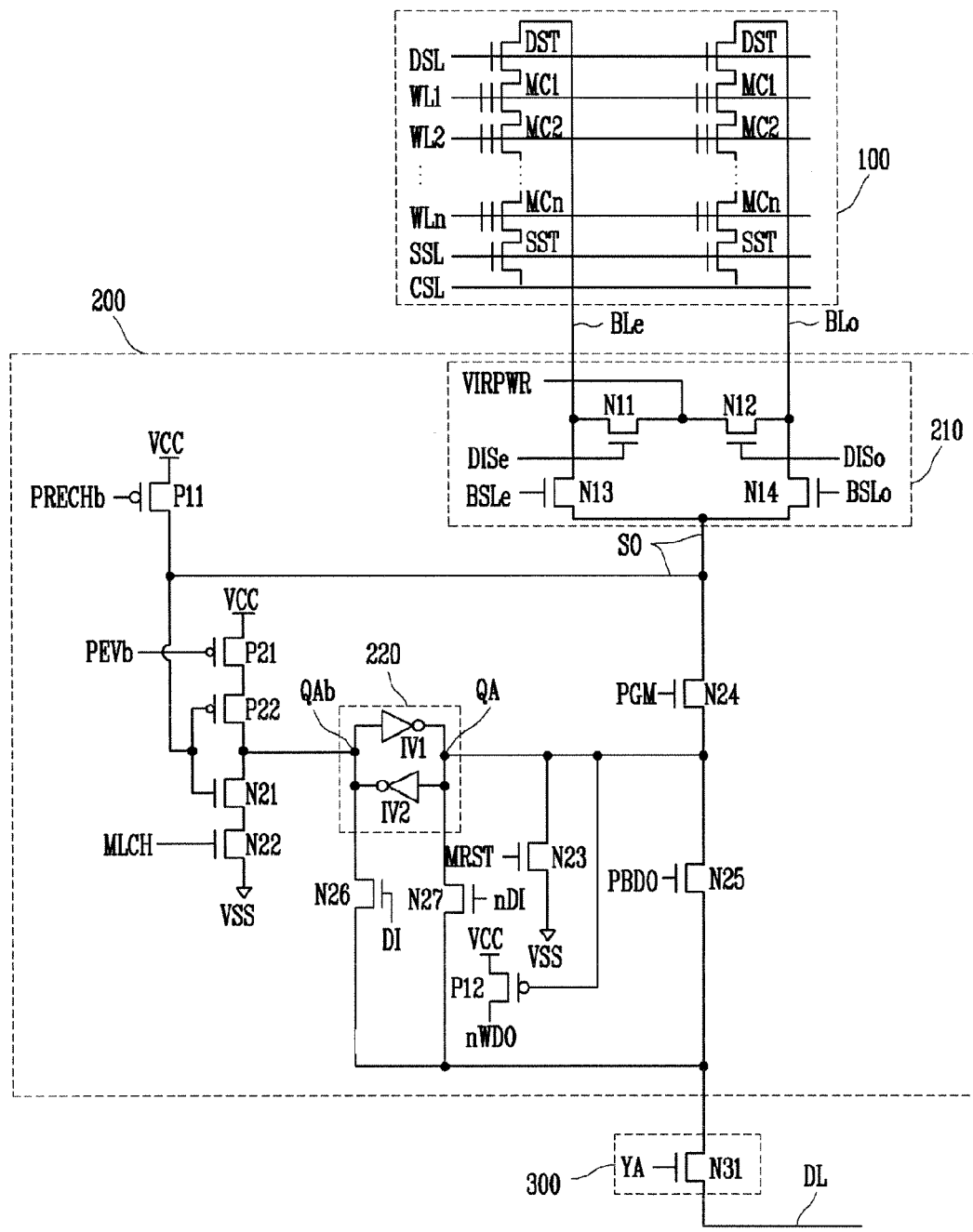
FIG. 2 is a circuit diagram of a NAND flash memory device having a page buffer for a pre-erase.

FIG. 2 is a circuit diagram of a NAND flash memory device that may have a page buffer for a pre-erase. The same reference numerals as those of FIG. 1 are used to identify the same or similar parts as those of FIG. 2.

Referring to FIG. 2, the NAND flash memory device may include a memory cell array 100, a page buffer 200 and a column select unit 300.

In the memory cell array 100, BLe indicates an even-numbered bit line, and BLo indicates an odd-numbered bit line. A plurality of memory cells MC1 to MCn is connected to the bit lines BLe, BLo, respectively, and is connected in series between a drain select transistor DST and a source select transistor SST to form one cell string. A memory cell (e.g., MC1) is controlled by one word line (e.g., WL1) and forms one page.

A plurality of the page buffers 200 may connected to the memory cell array 100. The plurality of page buffers performs a program, a read or an erase operation at the same time. In FIG. 2, only one page buffer 200 is shown. It is, however, to be understood that a plurality of the same page buffers can be connected to the memory cell array 100.

The page buffer 200 may include a bit line select and bias unit 210, a latch circuit 220, a precharge unit P11, an erase verify unit P12, pre-erase detection units P21, P22, main erase detection units N21, N22, a reset unit N23, a program transistor N24, a read transistor N25 and data input transistors N26, N27.

The bit line select and bias unit 210 may include bias supply transistors N11, N12 and bit line select transistors N13 and N14. The bias supply transistor N11 has one end connected to the bit line BLe and the other end connected to a line that applies a bias signal (VIRPWR). The bias supply transistor N11 has the gate supplied with a gate control signal (DISe). The bias supply transistors N11 is turned on according to a gate control signal (DISe) to apply the bias signal (VIRPWR) to a bit line (e.g., BLe). The bias supply transistor N12 has one end connected to the bit line BLo and the other end connected to a line that applies the bias signal (VIRPWR). The bias supply transistor N12 has the gate applied with a gate control signal (DISo). The bias supply transistor N12 is turned on according to the gate control signal (DISo) to apply the bias signal (VIRPWR) to a bit line (e.g., BLo). The select transistor N13 is turned on according to a bit line select signal (BSLe) to apply electric charge (current), which is received through the sensing line SO, to a selected bit line (e.g., BLe). The select transistor N14 is turned on according to the bit line select signal (BSLo) to apply electric charge (current), which is received through the sensing line SO, to a selected bit line (e.g., BLo).

The precharge unit P11 may include a PMOS transistor, which is connected between a power supply voltage (VCC) and the sensing line SO and has the gate applied with a precharge signal (PRECHb). The PMOS transistor P11 precharges the sensing line S0 with the power supply voltage (VCC) upon erase verify.

The latch circuit 220 includes a latch consisting of inverters IV1, IV2 and has a node QAb and a node QA.

The reset unit N23 may include a NMOS transistor, which is connected between the node QA of the latch circuit 220 and a ground voltage (VSS) and has the gate applied with a reset signal MRST. The NMOS transistor N23 is turned on according to the reset signal MRST during a main erase verify operation and initializes the node QA of the latch circuit 220 to logic low and the node QAB to logic high.

The pre-erase detection units P21, P22 may include PMOS transistors connected between the power supply voltage (VCC) and the node QAb of the latch circuit 200. The PMOS transistor P21 is turned on according to a pre-erase verify signal (PEVb) at the time of pre-erase verify and the PMOS transistor P22 is turned on at the time of a pre-erase operation when an erase cell has a voltage lower than the threshold voltage (Vt), i.e., the sensing line SO is discharged. The PMOS transistors P21, P22 change the node QAb of the latch circuit 220 to logic high and the node QA thereof to logic low in order to detect pre-erase when a cell is fully erased during the pre-erase operation.

The main erase detection units N21, N22 may include a NMOS transistors connected between the ground voltage (VSS) and the node QAb of the latch circuit 220. The NMOS transistor N21 is turned on when the sensing line S0 is in a precharged state and is turned off when the sensing line SO is in a discharged state, at the time of a main erase operation. The NMOS transistor N22 is turned on/off according to the main erase detection signal (MLCH). If the NMOS transistor N21 is turned on, the NMOS transistor N22 is turned on to change the node QAb of the latch circuit 220 to logic low and the node QA thereof to logic high. These NMOS transistors N21, N22 are turned off when a cell is fully erased and is turned on when a cell is not fully erased, thus detecting main erase, at the time of the main erase operation. These NMOS transistors N21, N22 also function to initialize the node QAb of the latch circuit 220 to logic low and the node QA thereof to logic high, at the time of the pre-erase operation.

The pre-erase detection signal (PEVb) becomes logic low at the pre-erase operation to turn on the PMOS transistor P21. The main erase detection signal (MLCH) becomes logic high at the main erase operation and the pre-erase operation to turn on the NMOS transistor N22.

The program transistor N24 may include a NMOS transistor, which is connected between the sensing line S0 and the node QA of the latch circuit 220 and has the gate applied with a program signal (PGM). The NMOS transistor N24 is turned on during a program operation to transmit data of the node QA of the latch circuit 220 to selected bit lines BLe or BLo through the sensing line SO, so that data are programmed into a memory cell.

The read transistor N25 may include a NMOS transistor, which is connected between the sensing line S0, the node QA of the latch circuit 220 and the column select unit 300, and has the gate applied with a read signal (PBDO). The NMOS transistor N25 is turned on during a read operation to transfer data of the node QA of the latch circuit 220, which are output from a selected bit line BLe or BLo, to a data line DL through the column select unit 300.

The data input transistors N26, N27 are turned on according to a program input signal (DI or nDI) during a program operation, and thus input program data, which are received through the column select unit 300, to the latch circuit 220.

The erase verify unit P12 is connected between the power supply voltage (VCC) and a node nWDO and has the gate connected to the node QA of the latch circuit 220. The PMOS transistor P12 functions to verify erase, and it verifies pass/fail of erase by reading data of the node QA of the latch circuit 220.

The column select unit 300 may include a NMOS transistor N31 controlled according to a column select signal (YA). The NMOS transistor N31 functions to connect the page buffer 200 and the data line DL during a read or program operation. The column select signal (YA) is generated by a column address.

Figure 3:
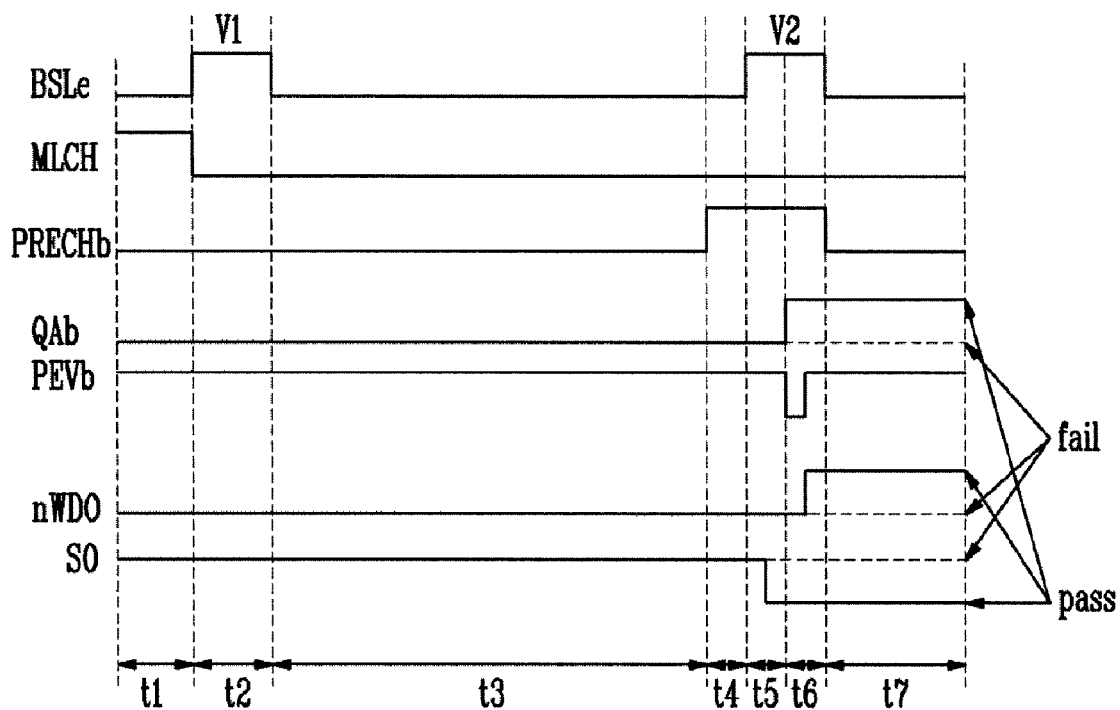
FIG. 3 is a timing diagram illustrating waveforms of signals of the NAND flash memory device shown in FIG. 2.

FIG. 3 is a timing diagram illustrating waveforms of the signals of the NAND flash memory device shown in FIG. 2.

Hereinafter, the operation of the page buffer for verifying pre-erase will be described with reference to FIGS. 2 and 3.

At a period t1, the node QAb of the latch circuit 220 is initialized to logic low and the node QA thereof is initialized to logic high according to the main erase detection signal (MLCH) and the precharged sensing node SO.

At a period t2, the bit line BLe is selected by the bit line select signal (BSLe) and the PMOS transistor P11 is turned on by the precharge signal (PRECHb) of logic low, so that the selected bit line BLe and the sensing node SO are precharged.

At a period t3, a bias voltage is applied to a well of a cell that is programmed to weakly erase the program data.

At a period t4, the precharge signal (PRECHb) become logic high and makes floated the sensing line SO.

At a period t5, the bit line select signal (BSLe) becomes again logic high to connect the bit line BLe and the sensing line SO.

At a period t6, the sensing line SO is discharged or kept to a precharged state. If the sensing line SO is in a discharged state, it means that pre-erase is pass. If the sensing line SO is kept to a precharged state, it means that pre-erase is fail. The pre-erase verify signal (PEVb) becomes logic low for a predetermined time and inputs a signal of the sensing node SO to the latch circuit 220.

At a period t7, it is determined whether pre-erase is pass or fail. If it is determined that pre-erase is fail, a pre-erase operation is performed. If it is determined that pre-erase is pass, a main erase operation is performed.

For example, if a programmed cell has a voltage lower than the threshold voltage (Vt) by the pre-erase operation and the sensing line SO is discharged as shown in FIG. 3, the PMOS transistor P22 is turned on and the pre-erase detection signal (PEVb) becomes logic low, so that the PMOS transistor P21 is turned on. As shown in FIG. 3, the node QAb of the latch circuit 220 becomes logic high and the node QA thereof becomes logic low. In this case, the PMOS transistor P12 for erase verify is turned on and the node nWDO becomes logic high. This verifies that pre-erase is pass. If the sensing line SO is in a precharged state, the node QAb of the latch circuit 220 is kept to its initial logic low and the node QA thereof is kept to its initial logic high. The PMOS transistor P12 is then turned off and the node nWDO becomes a floating state. This verifies that pre-erase is fail.

As described above, if the pre-erase operation is pass, a main erase operation is performed by applying an erase voltage to a well of a memory cell that has not been eased as well as a predetermined bias voltage and a bias voltage used in the pre-erase operation.

At this time, after the node QAb of the latch circuit 220 is initialized to logic high and the node QA thereof is initialized to logic low using the reset signal (MRST), the sensing line SO is precharged.

In the same manner as the pre-erase operation, if the current flowing through the sensing line SO is discharged, it will mean that the main erase operation is pass. If the sensing line SO is kept to a precharged state, it will mean that the main erase operation is fail.

If a cell to be erased has a voltage lower than the threshold voltage (Vt) and the sensing line SO is discharged, the NMOS transistors N21, N22 are turned off, so that the node QAb of the latch circuit 220 is kept to its initial logic high and the node QA thereof is kept to its initial logic low.

Therefore, the PMOS transistor P12 is turned on and the node nWDO becomes logic high, so that it is verified that the main erase operation is pass.

To the contrary, if the sensing line SO is in a precharged state, the NMOS transistors N21, N22 are turned on, so that the node QAb of the latch circuit 220 becomes logic low and the node QA thereof becomes logic high. Therefore, the PMOS transistor P12 is turned off and the node nWDO becomes a floating state. It is thus verified that the main erase operation is fail.

As described above, the present invention can provide a page buffer that can verify pre-erase. It is thus possible to prevent a cell that has been programmed from being excessively erased.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A non-volatile memory device, comprising:
   a cell array having a plurality of strings consisting of memory cells coupled to bit lines and word lines; and
   a plurality of page buffers connected to the bit lines through a sensing line,
   each of the plurality of page buffers comprises:
   a pre-erase detection unit that detects pre-erase in response to a signal of the sensing line and a pre-erase verify signal in order to verify whether data programmed into the memory cells have been erased;
   a main erase detection unit that detects main erase in response to the signal of the sensing line in order to verify whether data programmed into the memory cells have been erased;
   a latch circuit which stores data in response to an output signal of the pre-erase detection unit at the time of pre-erase verify and stores data in response to an output signal of the main erase detection unit at the time of main erase verify; and
   a verify unit that verifies pass or fail of the pre-erase or main erase in response to a signal of the latch circuit at the time of pre-erase verify or main erase verify,
   wherein the main erase detection unit initializes a first node of the latch circuit at the time of the pre-erase.

2. The non-volatile memory device as claimed in claim 1, wherein if the pre-erase verify is pass, the main erase is performed, and if the pre-erase verify is fail, the pre-erase is again performed.

3. The non-volatile memory device as claimed in claim 1, wherein the pre-erase detection unit is connected between a power supply voltage and the first node of the latch circuit, and controls the first node to have the power supply voltage when the pre-erase is successful.

4. The non-volatile memory device as claimed in claim 1, wherein the pre-erase detection unit includes a first PMOS transistor that is turned on according to the pre-erase verify signal that becomes logic low only at the tune of the pre-erase verify, and a second PMOS transistor that is turned on when the signal of the sensing line becomes logic low at the time of the pre-erase verify.

5. The non-volatile memory device as claimed in claim 1, wherein a first node of the latch circuit becomes logic low and a second node thereof becomes logic high at the time of the pre-erase.

6. The non-volatile memory device as claimed in claim 1, wherein each of the plurality of page buffers further includes a reset unit that initializes the first node of the latch circuit to logic high and a second node thereof to logic low for the main erase verify.

7. The non-volatile memory device as claimed in claim 1, wherein each of the plurality of page buffers includes a precharge unit that precharges the sensing line in order to verify the pre-erase or main erase; and
   a bit line select and bias unit that selects one of the bit lines.

* * * * *